(12) United States Patent
Low et al.

(10) Patent No.: US 7,863,520 B2
(45) Date of Patent: Jan. 4, 2011

(54) INTERFACING TWO INSULATION PARTS IN HIGH VOLTAGE ENVIRONMENT

(75) Inventors: Russell J. Low, Rowley, MA (US);
Kasegn D. Tekletsadik, Rexford, NY (US); Anthony Renau, West Newbury, MA (US); Piotr R. Lubicki, Peabody, MA (US); D. Jeffrey Lischer, Acton, MA (US); Steve Krause, Ipswich, MA (US); Eric Hermanson, Georgetown, MA (US); Doug E. May, Melrose, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 457 days.

(21) Appl. No.: 11/838,360

(22) Filed: Aug. 14, 2007

(65) Prior Publication Data
US 2009/0047801 A1 Feb. 19, 2009

(51) Int. Cl.
*H01R 4/02* (2006.01)
(52) U.S. Cl. .................................. 174/88 R; 174/73.1
(58) Field of Classification Search ................ 174/15.3, 174/73.1, 88 R, 88 B
See application file for complete search history.

(56) References Cited

U.S. PATENT DOCUMENTS

| 3,280,245 A | * | 10/1966 | Rodeseike | ............... 174/88 B |
| 3,588,319 A | * | 6/1971 | Isogai et al. | ............... 174/143 |
| 4,227,035 A | * | 10/1980 | Runnels et al. | ........... 174/15.3 |

* cited by examiner

*Primary Examiner*—Chau N Nguyen

(57) ABSTRACT

Methods of interfacing parts in a high voltage environment and related structures are disclosed. A method comprises: providing an insulation medium between a first part and a second part in a high voltage environment; and interfacing the first part and the second part by compressing the first part and the second part against the insulation medium.

5 Claims, 8 Drawing Sheets

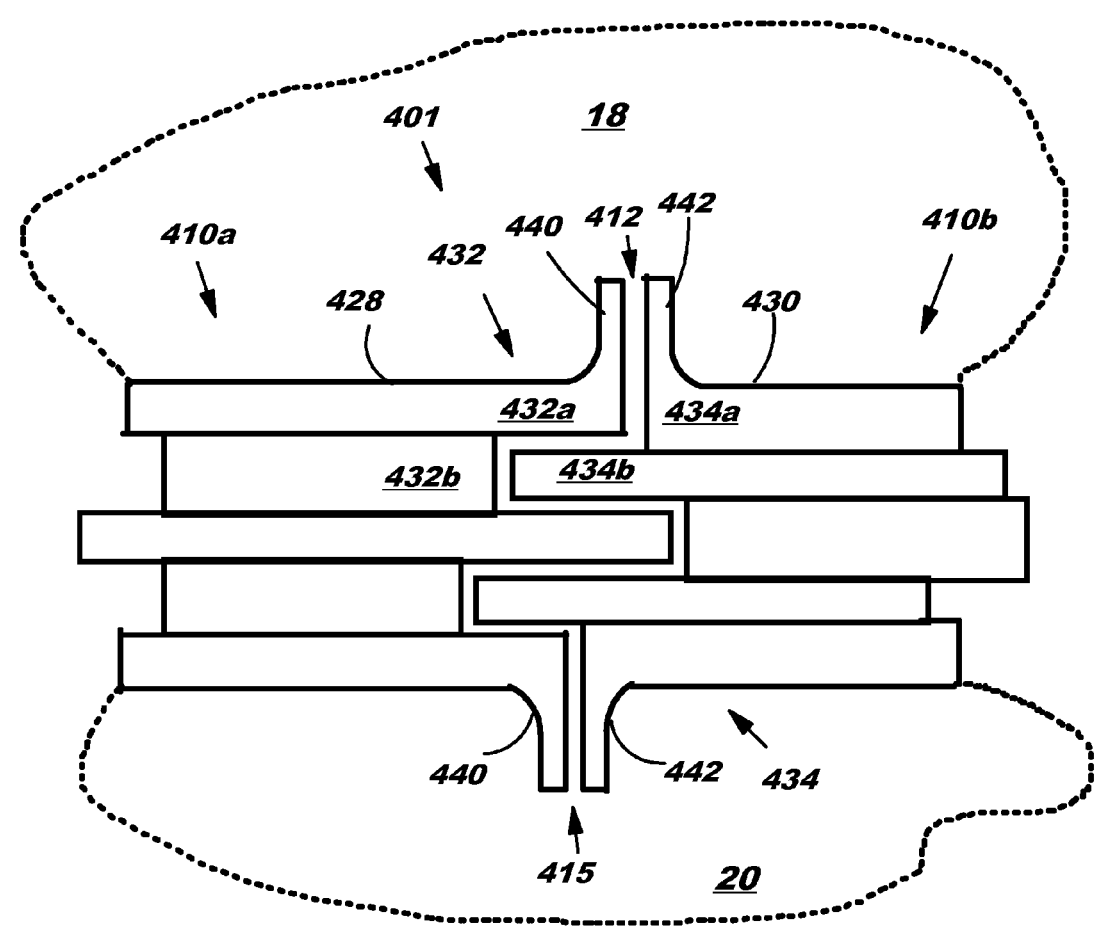

INTERFACING TWO INSULATION PARTS IN HIGH VOLTAGE ENVIRONMENT

BACKGROUND

1. Technical Field

The disclosure relates generally to methods of interfacing insulation parts, and more particularly, to methods of interfacing insulation parts in a high voltage environment.

2. Background Art

Ion implantation is a standard technique for introducing conductivity altering impurities into, or doping, semiconductor wafers. A typical ion implantation process uses an energetic ion beam to introduce impurities (ions) into semiconductor wafers. During ion implantation, a source feed material is energized to generate an ion beam, and the generated ion beam needs to be accelerated by an acceleration column. An acceleration column may be required to accelerate an ion beam at, for example, 670 kV.

A structure at a voltage (hereinafter "voltage structure"), also referred to as a "terminal structure", in an ion implantation system requires insulation to allow the structure to reach the required high voltage, e.g., 670 kV. Choosing insulation materials that can be manufactured in the sizes required for the voltage structure is challenging. As such, fabrication of smaller pieces that can be interfaced to form the insulation for the voltage structure is a reasonable alternative. However, conventional technologies do not provide a solution for interfacing insulation parts in a high voltage environment, e.g., the high voltage of the structure.

One problem faced by conventional interfacing technologies is that to avoid puncture and/or flash over failures (which cause, e.g., an electrical shorting) in the interface between two interfacing insulation parts, the creepage distance along the surface of the interface between two electric potentials of the high voltage environment needs to be long enough. However, it is not preferable to make the insulation parts very thick to achieve the long creepage distance. For example, many plastics have a flashover breakdown in air of 12 kV/inch, which requires a creepage distance of more than 58 inches to avoid a flashover failure in a high voltage environment of, e.g., 670 kV. A breakdown failure caused by puncturing through a material may occur depending upon the dielectric strength of the material. Since many plastics can have dielectric strength of more than 600 kV per inch, it is possible to insulate a voltage structure at 670 kV with approximately 2 inches of plastic (sufficient for design overhead). For a completely sealed cube, this is sufficient. However, where insulation parts are simply interfaced to form the insulation for the voltage structure, problems of surface flashover need to be addressed, especially for designs with short creepage distances between the voltage structure, and the ground. The design rule for surface flashover is typically 10 kV per inch. For a voltage structure at 670 kV, this design rule equates to 67 inches of creepage distance, which is sufficiently large as to present a limitation in design possibilities.

SUMMARY

A first aspect of the disclosure provides a method for interfacing two parts, the method comprising: providing an insulation medium between a first part and a second part in a high voltage environment; and interfacing the first part and the second part by compressing the first part and the second part against the insulation medium.

A second aspect of the disclosure provides a method for interfacing two parts in a high voltage environment, the method comprising: providing a first part that includes a first staggered laminate; providing a second part that includes a second staggered laminate, the second staggered laminate matching the first laminate in a complementary manner; and interfacing the first part and the second part by interlocking the first staggered laminate and the second staggered laminate to force air out of an interface between the first part and the second part.

A third aspect of the disclosure provides a method of interfacing two parts in a high voltage environment, the method comprising: providing a first part and a second part; interfacing the first part and the second part to create an area of a substantially zero electrical field at an outer extent of an interface between the first and second parts and a reduced electrical field area in a different portion of the interface.

A fourth aspect of the disclosure provides a joint comprising: a first insulation part and a second insulation part, each positioned between a first electrical potential and a second different electrical potential; wherein the first insulation part interfaces with the second insulation part through respective interface portions thereof, each interface portion including an extension portion extending toward at least one of the first environment and the second environment; and wherein the interface portion of the first insulation part includes a first staggered laminate and the interface portion of the second insulation part includes a second staggered laminate, the first and second staggered laminates interlocked.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIGS. 7-8 show schematically an insulation interface of an insulation device for the structure at a voltage of FIG. 6 formed by the interfacing methods of FIGS. 1-5.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
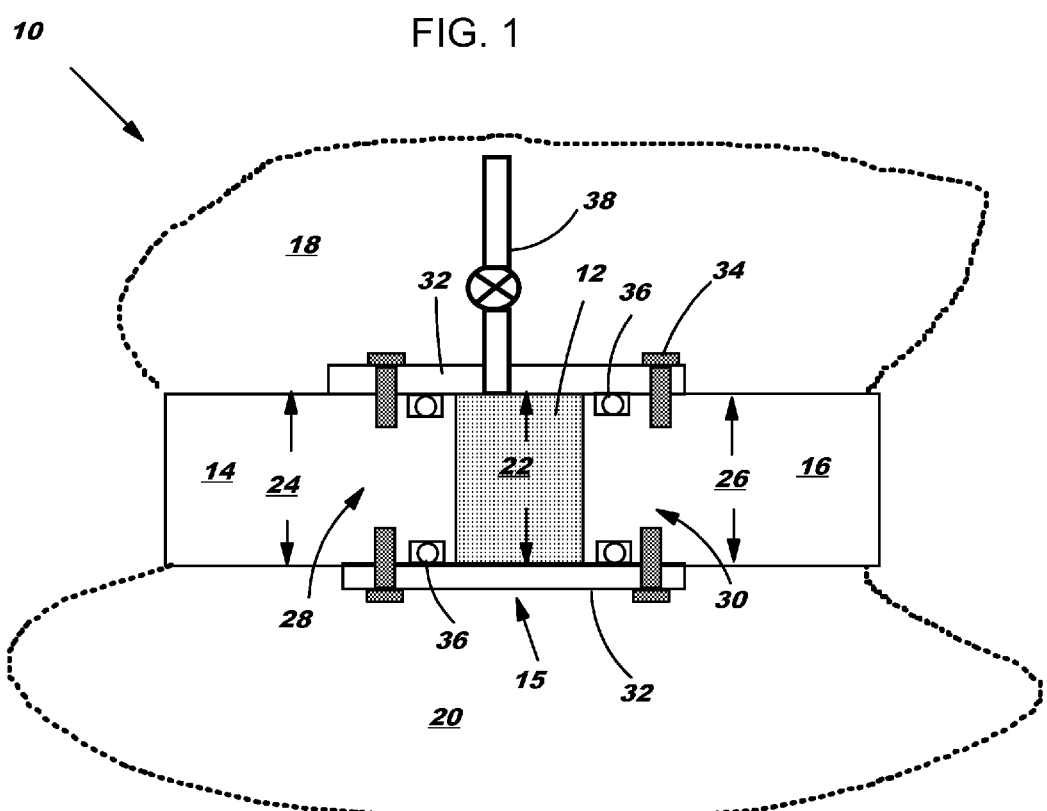
FIGS. 1-5 show schematically embodiments of methods for interfacing two parts in a high voltage environment.

Referring to the drawings, FIG. 1 shows schematically embodiments of an interfacing method for interfacing two parts in a high voltage environment. As shown in FIG. 1, an insulation medium 12 is provided between insulation part 14 and insulation part (hereinafter "part") 16 to be interfaced in a high voltage environment 10. Insulation parts 14, 16 may include any dielectric material, for example, a plastic material. High voltage environment 10 includes a high electric potential environment 18 on one side (upper side for illustration) of parts 14 and 16, and a low electric potential environment 20 on the other side (lower side for illustration). Creepage distance 22 along a surface of insulation medium 12 is substantially equivalent to thickness 24, 26 of interface portions 28, 30 of parts 14, 16, respectively. As such, insulation material 12 may be selected by considering thickness 24, 26 and the breakdown voltages of insulation materials.

Preferably, parts 14, 16 may be interfaced by compressing parts 14, 16 against insulation medium 12 to, e.g., eliminate air between parts 14 and 16 and on the surface of insulation medium 12 such that dielectric strength in an interface 15 between parts 14 and 16 is increased. To maintain the compression, a coupling mechanism, such as a bolt or a clamp, may be used in interfacing parts 14 and 16 as will be described herein.

Insulation medium 12 may include one of: gas, vacuum, liquid, or a solid material. The solid material may be solid silicone rubber or double-sided poly vinyl chloride (PVC) tape. According to an embodiment, preferably, a rubber gasket of solid silicone rubber may be used to implement insulation medium 12. The gas may be pressurized air or Sulfur Hexafluoride ($SF_6$), for example. Note that pressurized gases (e.g., air) have a linear relationship between flashover voltage and pressure. For the same pressure, $SF_6$ has a twice higher flashover voltage capability per inch than pressurized air. The liquid may be silicone grease and/or liquid silicone rubber. According to an embodiment, in the case where gas, liquid or vacuum is used to implement insulation medium 12, plates 32 may be used to, e.g., keep insulation medium 12 within interface 15. Specifically, plates 32 may be coupled to parts 14, 16 through, for example, bolts 34. In addition, O-rings 36 may be positioned between plates 32 and parts 14, 16, respectively, and more adjacent to interface 15 than bolts 36 to create a sealed region within interface 15. A port 38 may be used to pull air out of sealed interface 15 to create a vacuum 12. Port 38 may also be used to add liquid or gas into sealed interface 15 as insulation medium 12. Plates 32 may be of any materials, e.g., insulator (plastic) and/or conductor. Other mechanisms may also be used to implement insulation medium 12 with gas, vacuum, or liquid materials.

Figure 2:
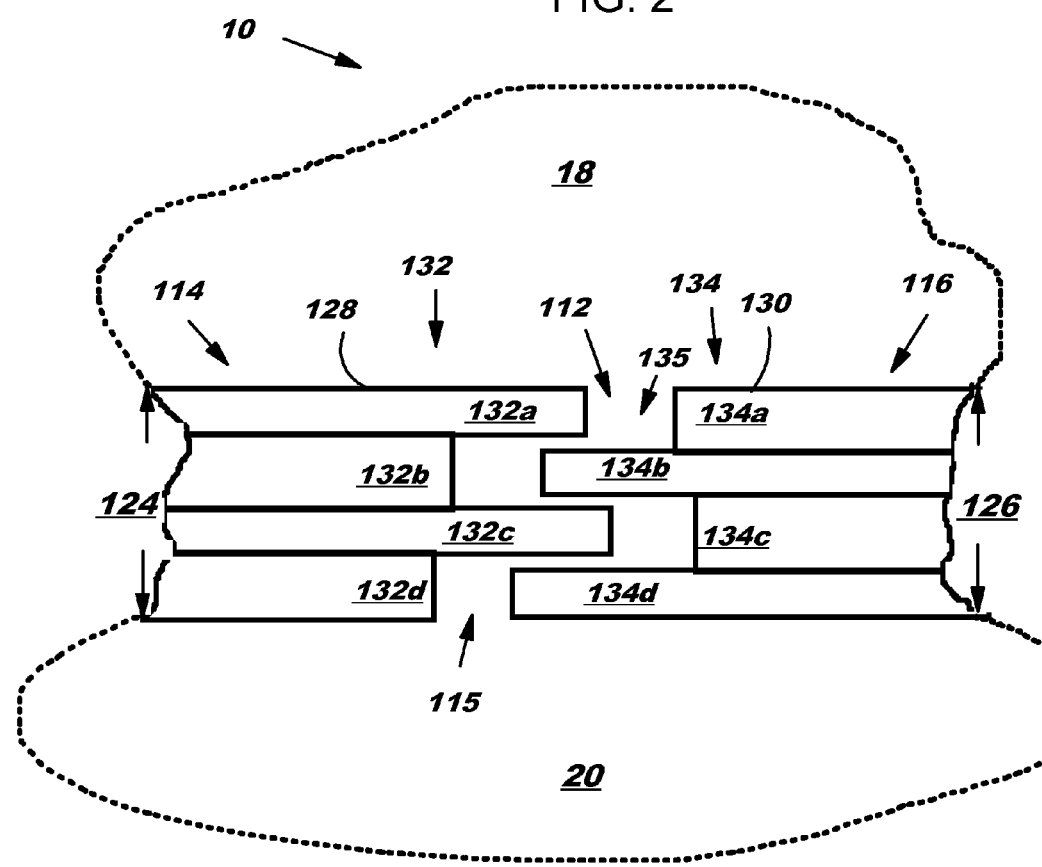

FIG. 2 shows another embodiment for interfacing two parts in a high voltage environment 10. In FIG. 2, part 114 includes an interface portion 128 that includes a staggered laminate 132, with four layers 132a, 132b, 132c, and 132d shown for illustrative purposes. That is, two immediately adjacent layers, e.g., 132a and 132b, extend outward to different distances. Preferably, according to an embodiment, all layers 132 extend outward to different distances.

Part 116 includes an interface portion 130 that includes a staggered laminate 134, with four layers 134a, 134b, 134c, and 134d shown for illustrative purposes. Staggered laminate 134 matches staggered laminate 132 in a complementary manner such that when part 116 interfaces part 114, each layer of staggered laminate 134 contacts a respective layer of staggered laminate 132. For example, layer 134a will contact layer 132a, layer 134b will contact layer 132b, layer 134c will contact layer 132c, and layer 134d will contact layer 132d. As layers of a staggered laminate 132, 134 extend outward to different distances, when part 114 interfaces part 116, a layer of staggered laminate 132, e.g., layer 132a, may overlap a layer of staggered laminate 134, e.g., layer 134b. That is, staggered laminate 132 interlocks with staggered laminate 134. Staggered laminates 132, 134 can be achieved by stacking up multiple layers to form parts 114, 116 or by machining laminate layers into parts 114, 116 as single pieces, respectively. Other ways to make staggered laminates 132, 134 are also possible.

In this embodiment, a creepage distance 135 between high electric potential 18 and low electric potential 20 is formed in a zigzag manner along a surface of an interface medium 112 between staggered laminates 132, 134. Creepage distance 135 is thus substantially longer than thickness 124, 126 of parts 114, 116, respectively. In this manner, a high flashover voltage of interface medium 112 can be achieved without increasing the thickness of parts 114, 116. When all layers of staggered laminates 132, 134 extend outward to different distances, interfaces between corresponding layers of staggered laminate 132 and 134 misalign with one another, thus maximizing creepage distance 135 and flashover voltage.

For the FIG. 2 embodiment, interface medium 112 may be selected from gas, liquid, vacuum, or a solid material. According to one embodiment, interface medium 112 is a rubber gasket of silicone rubber. Preferably, parts 114, 116 are interfaced in a manner that the interlocking of staggered laminates 132, 134 forces air out of an interface 115 between parts 114 and 116.

Figure 3:
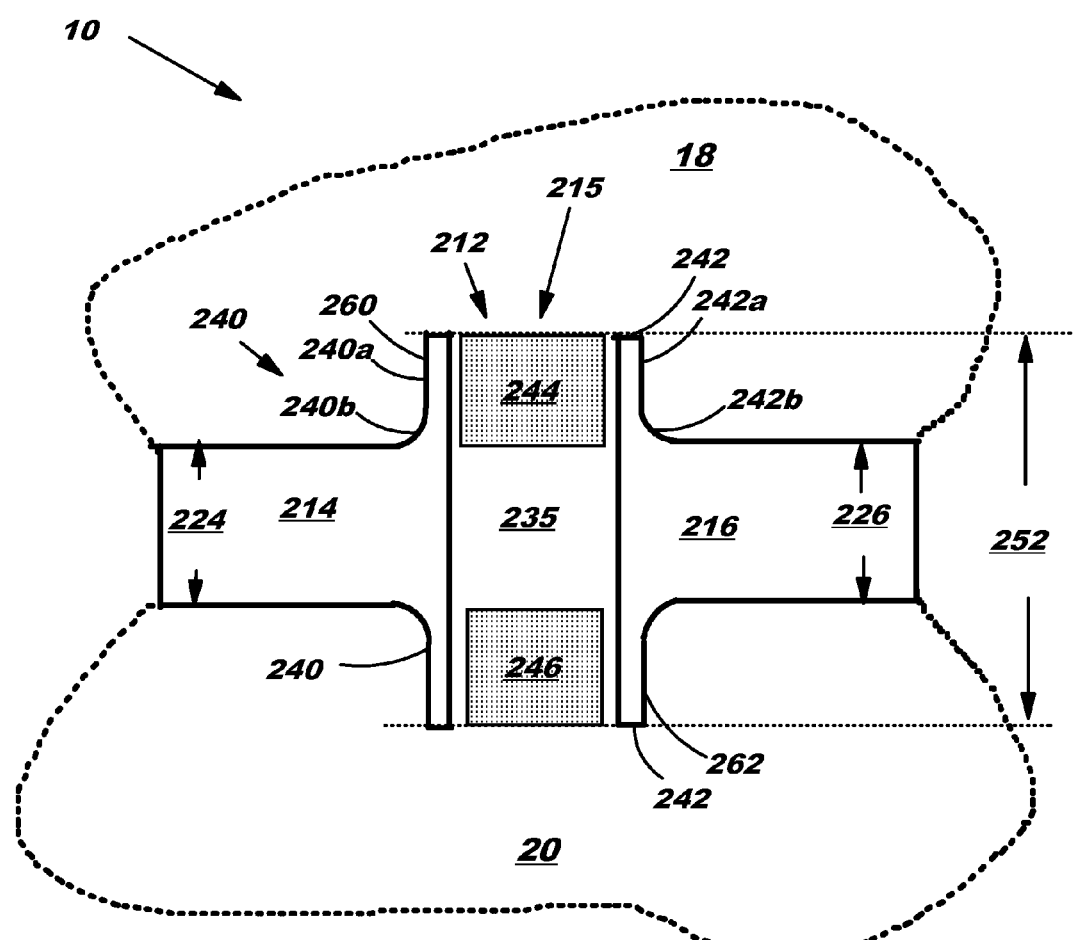
Figure 4:
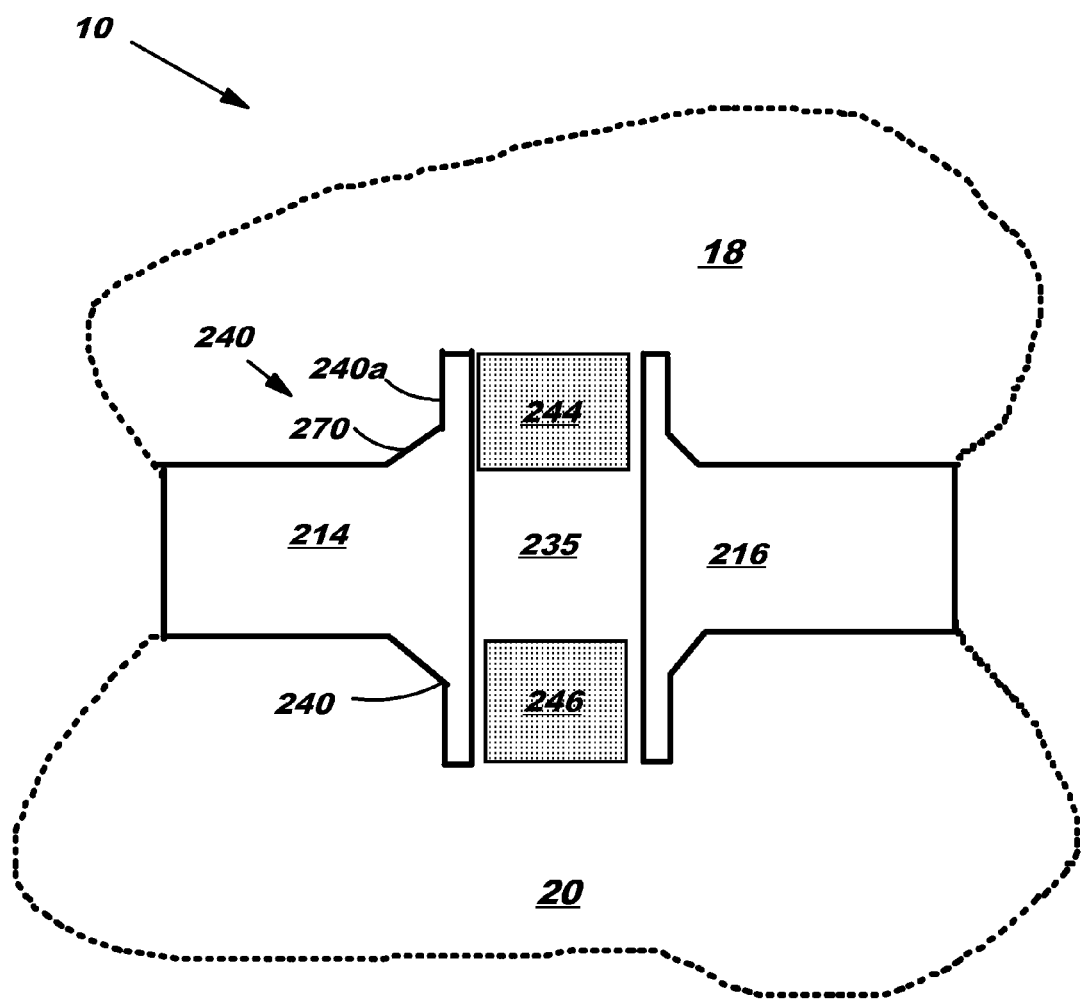
Figure 5:
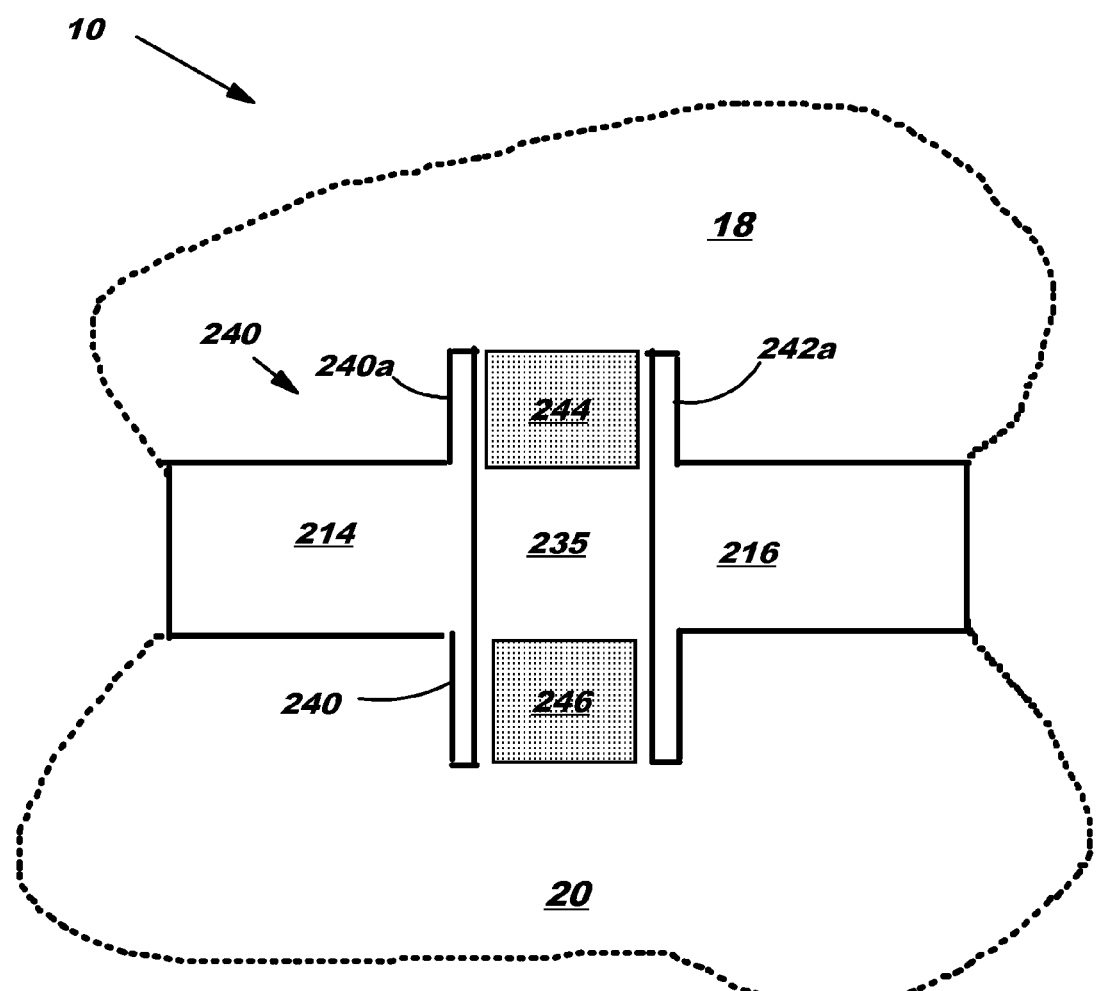

FIG. 3 shows another embodiment for interfacing two parts in a high voltage environment 10. In this embodiment, parts 214 and 216 each include an extension portion 240, 242 adjacent to an interface 215. In a cross-sectional view, as shown in FIG. 3, extension portions 240, 242 extend toward at least one of high electric potential environment 18 and low electric potential environment 20. In one embodiment, extension portions 240, 242 each include a substantially straight portion 240a, 242a and a non-straight portion 240b, 242b, respectively. Preferably, non-straight portion 240b, 242b is substantially concave ("concave"), as shown in FIG. 3. However, this embodiment does not limit the scope of the disclosure. Non-straight portion 240b, 242b may have other shapes. For example, FIG. 4 shows a non-straight portion 270 which is substantially a slope relative to straight portion 240a and other portions of part 214. According to an alternative embodiment, extension portion 240, 242 may include only straight portion 240a, 242a, as shown in FIG. 5. Returning to FIG. 3, non-straight portion 240b, 242b is adjacent to other portions of part 214, 216, respectively, and may be concave relative to at least one of high electrical potential environment 18 and low electrical potential environment 20. Substantially straight portions 240a, 242a include substantially straight sides 260, 262 opposite to interface 215. According to an embodiment, substantially straight sides 260, 262 are substantially parallel to one another. The shapes of extension portions 240, 242 make the high electrical potential 18 and low electrical potential 20 each flare out along extension portions 240, 242, respectively. As a consequence, areas 244, 246 of substantially zero electrical field are created at outer extents of interface 215 adjacent to high electrical potential environment 18 and low electrical potential environment 20, respectively. Substantially zero electrical field areas 244, 246 may be completely within interface 215 or may be slightly beyond interface 215. In addition, a reduced electrical field area 235 (compared to the electrical field between high electrical potential 18 and low electrical potential 20) is created in a portion of interface 215 between substantially zero electrical field areas 244, 246. The value of reduced electrical field area 235 depends on, among others, thickness 224, 226 of parts 214, 216, respectively, length 252 of interface 215 between high electrical potential environment 18 and low electrical potential environment 20, and the electrical field between high electrical potential 18 and low electrical potential 20. As such, the extent of reduced electrical field area 235 can be controlled to be within the breakdown voltage of interface medium 212 used in interface 215. Substantially zero electrical field areas 244, 246 are created because the electrical potentials outside straight portions 240a, 242a and hence areas 244, 246, respectively, are the same. Substantially zero electrical field areas 244, 246 prevent flow of charge between high electrical potential 18 and low electrical potential 20. As a consequence, a flashover failure along interface 215 can be avoided.

For the FIGS. 3-5 embodiments, interface medium 212 may be selected from gas, liquid, vacuum, or a solid material. It should be appreciated that the embodiments of FIGS. 1-5 can be applied separately or be combined in any manner.

Figure 6:
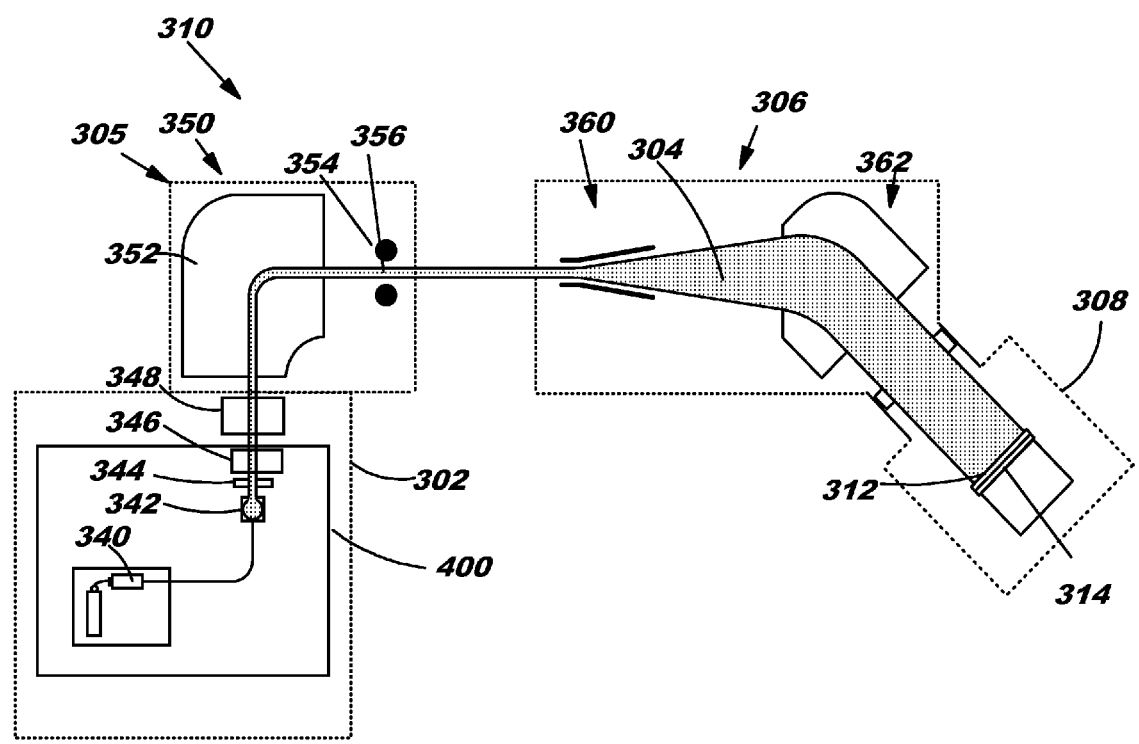
FIG. 6 shows an illustrative ion implanting device including a structure at a voltage.

With reference to the accompanying drawings, FIG. 6 shows an illustrative ion implantation system 310. Ion implantation system 310 includes an ion beam generating system 302 for generating and transmitting an ion beam 304, through ion beam filtering system 305 and ion beam scanning system 306, to a target system 308. Ion beam generating system 302 may include any now known or later developed ion beam generator such as those available from Varian Semiconductor Equipment Associates. Typically, target system 308 includes one or more semiconductor targets 312 (e.g., a wafer) mounted to a platen 314. Ion implantation system 310 may include additional components known to those skilled in the art. It will be understood that the entire path traversed by ion beam 304 is evacuated during an ion implantation.

Besides the above-described components, ion beam generating system 302 may include a gas flow 340, an ion beam source 342, an extraction manipulator 344, a source filter magnet 346, and an accelerating/decelerating column 348. Gas flow 340, ion beam source 342, extraction manipulator 344 and filter magnet 346 are contained in a voltage structure 400. Acceleration/deceleration column 348 is positioned between source filter magnet 346 and mass analyzer 350.

Ion beam filtering system 305 may include a mass analyzer 350 including, for example, a dipole analyzing magnet 352 with a semicircular radius, and a mass resolving slit 354 having a resolving aperture 356. As is known in the art, ion beam 304 may include different combinations of ions in different stages of the path it traverses.

Scanning system 306 may include, for example, a scanner 360 and an angle corrector 362. Scanner 360, which may be an electrostatic scanner, deflects filtered ion beam 304.

Although an illustrative ion implantation system 310 has been described above, it should be understood by those skilled in the art that the current disclosure can be used with any now known or later developed system to generate and scan ion beam 304. It should be understood that the current disclosure can be used with any now known or later developed process and methods of ion implantation.

Figure 7:
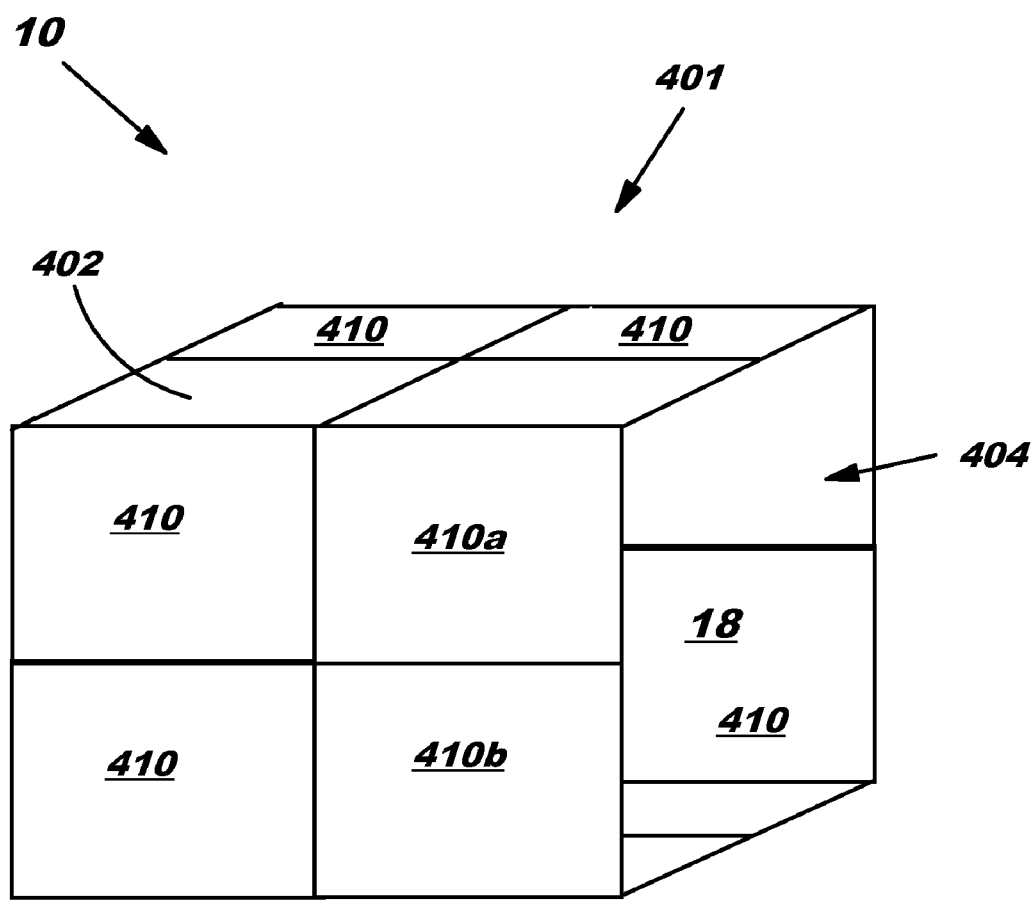

FIG. 7 shows a joint 401 of insulation parts of voltage structure 400 of FIG. 6. Joint 401 includes multiple insulation parts 410 interfaced together. Parts 410 may form a tube (as shown in FIG. 7) or an enclosed hollow shape including an exterior surface 402 and an interior surface 404. Interior surface 404 contacts a high electric potential environment 18, i.e., the voltage of structure 400 at e.g., 670 kV, while exterior surface 402 contacts a low electric potential environment 20, e.g., ground. That is, each insulation part 410 contacts high electric potential environment 18 and low electric potential environment 20 with two surfaces.

FIG. 8 shows, in a cross-sectional view, an interface 415 between two parts 410, e.g., 410a and 410b, of FIG. 7. Parts 410a and 410b are interfaced through interface portions 428, 430 thereof, respectively. Interface portions 428, 430 each includes an extension portion 440, 442, respectively, that extends toward at least one of high electric potential environment 18 and low electrical potential environment 20 and may include the features shown in FIGS. 3-5. Interface portions 428, 430 of parts 410a, 410b include staggered laminates 432, 434, respectively. Staggered laminates 432, 434 complementarily match one another such that a layer, e.g., layer 432a, of staggered laminate 432 overlaps a layer of staggered laminate 434, e.g., layer 434b, and that staggered laminates 432, 434 interlock with one another. Preferably, all layers of a staggered laminate 432 or 434 extend outward to different distances, and interfaces between corresponding layers of staggered laminates 432, 434 misalign with one another. Joint 401 may also include an interface medium 412 between two parts, e.g., 410a, 410b, that are interfaced together.

In the above description of FIGS. 7 and 8, joint 401 of insulation parts 410 has been shown as part of voltage structure 400 in ion implantation system 310 for illustrative purposes. However, this specific application of joint 401 does not limit the scope of the disclosure. The interfacing of multiple insulation parts to form joint 401 may be used for other devices in a high voltage environment, and all are included. For example, acceleration/deceleration column 348 (FIG. 6) may include a joint 401 of multiple insulation parts interfaced as represented in FIGS. 7 and 8.

It is apparent that there have been provided with this disclosure approaches for interfacing parts in high voltage environment and the resulted structures. While the disclosure has been particularly shown and described in conjunction with a preferred embodiment thereof, it will be appreciated that variations and modifications can be effected by a person of ordinary skill in the art without departing from the scope of the disclosure.

What is claimed is:

1. A method for interfacing two parts, the method comprising:
providing an insulation medium between a first part and a second part in a high voltage environment;
interfacing the first part and the second part by compressing the first part and the second part against the insulation medium; and
increasing a creepage distance along the insulation medium between an environment of a first electric potential and an environment of a second electric potential wherein the increasing includes providing the first part with a first staggered laminate and the second part with a second staggered laminate, the second staggered laminate matching the first staggered laminate in a complementary manner such that when the first staggered laminate and the second staggered laminate interface, the first staggered laminate and the second staggered laminate are interlocked.

2. The method of claim 1, wherein the insulation medium includes one of: gas, silicone grease, silicone rubber, or a double-sided poly vinyl chloride (PVC) tape.

3. The method of claim 2, wherein the insulation medium includes a rubber gasket of silicone rubber.

4. A method for interfacing two parts in a high voltage environment, the method comprising:
providing a first part that includes a first staggered laminate;
providing a second part that includes a second staggered laminate, the second staggered laminate matching the first laminate in a complementary manner; and
interfacing the first part and the second part by interlocking the first staggered laminate and the second staggered laminate to force air out of an interface between the first part and the second part, wherein an interface medium is provided between the first part and the second part, wherein the interface medium includes one of: pressurized air, sulfur hexafluoride ($SF_6$), silicone grease, silicone rubber, or double-sided poly vinyl chloride (PVC) tape.

5. The method of claim 4, wherein the interface medium includes a rubber gasket of silicone rubber.

* * * * *